United States Patent
Han et al.

(10) Patent No.: US 11,139,406 B2
(45) Date of Patent: Oct. 5, 2021

(54) SOLAR CELL

(71) Applicant: LG ELECTRONICS INC., Seoul (KR)

(72) Inventors: Wonsuk Han, Seoul (KR); Jinsung Kim, Seoul (KR); Haejong Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 171 days.

(21) Appl. No.: 14/498,689

(22) Filed: Sep. 26, 2014

(65) Prior Publication Data
US 2015/0090334 A1   Apr. 2, 2015

(30) Foreign Application Priority Data
Sep. 27, 2013   (KR) .................. 10-2013-0115451

(51) Int. Cl.
*H01L 31/0224*   (2006.01)
*H01L 31/02*   (2006.01)

(52) U.S. Cl.
CPC .. *H01L 31/022433* (2013.01); *H01L 31/0201* (2013.01); *Y02E 10/50* (2013.01)

(58) Field of Classification Search
CPC ......... H01L 31/022433; H01L 31/0201; Y02E 10/50–58
USPC ................................................ 136/243–265
See application file for complete search history.

(56) References Cited

U.S. PATENT DOCUMENTS

| | | | | |
|---|---|---|---|---|
| 4,487,989 | A * | 12/1984 | Wakefield | H01L 31/022433 136/256 |
| 5,279,682 | A * | 1/1994 | Wald | H01L 31/022425 136/256 |
| 2005/0000561 | A1 | 1/2005 | Baret et al. | |
| 2009/0277491 | A1 | 11/2009 | Nakamura et al. | |
| 2010/0018562 | A1 | 1/2010 | Kurahashi et al. | |
| 2010/0224228 | A1 | 9/2010 | Kim et al. | |
| 2010/0229740 | A1 | 9/2010 | Mitta et al. | |
| 2011/0011440 | A1 | 1/2011 | Hioki et al. | |
| 2011/0297224 | A1* | 12/2011 | Miyamoto | H01L 31/0504 136/256 |
| 2011/0308601 | A1 | 12/2011 | Kim et al. | |
| 2012/0042925 | A1 | 2/2012 | Pfennig | |
| 2012/0100666 | A1* | 4/2012 | Gee | H01L 21/67706 438/98 |

(Continued)

FOREIGN PATENT DOCUMENTS

DE   20 2010 017 906 U1   3/2013
JP   2000-261012 A   9/2000

(Continued)

*Primary Examiner* — Matthew T Martin
(74) *Attorney, Agent, or Firm* — Birch, Stewart, Kolasch & Birch, LLP (57) ABSTRACT

Discussed is a solar cell including a photoelectric converter and first and second electrodes connected to the photoelectric converter. The first electrode includes a finger electrode including a plurality of finger electrode portions and a bus bar electrode including a main portion formed in a direction crossing the finger electrode portions, and at least one protrusion protruding from the main portion and formed in the direction crossing the plurality of finger electrode portions. The protrusion is formed across at least two of the finger electrode portions.

20 Claims, 8 Drawing Sheets

(56) References Cited

U.S. PATENT DOCUMENTS

| | | | |
|---|---|---|---|
| 2012/0125396 A1* | 5/2012 | Taira | H01L 31/022433 136/244 |
| 2012/0227785 A1* | 9/2012 | Tsuruoka | H01L 31/022425 136/244 |
| 2014/0338719 A1 | 11/2014 | Kobamoto et al. | |
| 2015/0364633 A1* | 12/2015 | Hosomi | H01L 31/18 136/255 |
| 2016/0126374 A1* | 5/2016 | Kim | H01L 31/02021 136/256 |
| 2017/0278998 A1* | 9/2017 | Yamarin | H01L 31/068 |

FOREIGN PATENT DOCUMENTS

| | | |
|---|---|---|
| JP | 2005-294679 A | 10/2005 |
| JP | 2006-278742 A | 10/2006 |
| JP | 2008-135655 A | 6/2008 |
| JP | 2009-141264 A | 6/2009 |
| JP | 2010-208317 A | 9/2010 |
| JP | 2011-77362 A | 4/2011 |
| JP | 2011-187882 A | 9/2011 |
| JP | 2012-4571 A | 1/2012 |
| JP | 2013-179371 A | 9/2013 |
| WO | WO 2006/137746 A1 | 12/2006 |
| WO | WO 2009/122977 A1 | 10/2009 |
| WO | WO 2013/039158 A1 | 3/2013 |
| WO | WO 2013/100856 A2 | 7/2013 |

* cited by examiner

SOLAR CELL

CROSS-REFERENCE TO RELATED APPLICATION

This application claims the priority benefit of Korean Patent Application No. 10-2013-0115451, filed on Sep. 27, 2013 in the Korean Intellectual Property Office, the disclosure of which is incorporated herein by reference.

BACKGROUND OF THE INVENTION

1. Field of the Invention

Embodiments of the invention relate to a solar cell, and more particularly to a solar cell having an improved electrode structure.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy using semiconductor devices.

A solar cell is designed such that various layers, electrodes and the like are formed on a substrate. Neighboring solar cells are electrically connected to each other using a ribbon, the ribbon being connected to a bus bar electrode. However, due to an alignment error or a difference between widths of the ribbon and the bus bar electrode, for example, disconnection may occur at a portion of a finger electrode connected to the bus bar electrode, the finger electrode being connected to a portion of the bus bar electrode proximate to the attached position of the ribbon. In addition, the alignment error may reduce a contact area between the ribbon and the bus bar electrode. This may result in deterioration in the output power and reliability of a solar cell module.

SUMMARY OF THE INVENTION

Therefore, the embodiments of the invention have been made in view of the above problems, and it is an object of the embodiments of the invention to provide a solar cell having high efficiency and reliability.

In accordance with one embodiment of the invention, the above and other objects can be accomplished by the provision of a solar cell including a photoelectric converter and first and second electrodes connected to the photoelectric converter, wherein the first electrode includes a finger electrode including a plurality of finger electrode portions and a bus bar electrode including a main portion formed in a direction crossing the plurality of finger electrode portions, and at least one protrusion protruding from the main portion and formed in the direction crossing the plurality of finger electrode portions, and wherein the at least one protrusion is formed across at least two of the plurality of finger electrode portions.

A protruding length of the at least one protrusion may be less than a width of the main portion.

A protruding length of the at least one protrusion may be in a range of 0.1 mm to 0.7 mm.

A width of the at least one protrusion may be in a range of 2 mm to 10 mm.

The at least one protrusion may be formed across two to ten finger electrode portions among the plurality of finger electrode portions.

A width of a portion of the bus bar electrode provided with the at least one protrusion may be in a range of 2.1 mm to 3.4 mm.

The at least one protrusion may include end protrusions respectively located at opposite ends of the main portion.

The end protrusions may be symmetrically arranged at opposite sides of the main portion.

The solar cell may further include a ribbon connected to the first electrode, the ribbon may have one end located on the bus bar electrode and the other end extending to a neighboring solar cell, the end protrusions may include a first end protrusion proximate to the end of the ribbon located on the bus bar electrode, and a second end protrusion located opposite to the first end protrusion, and a width of the first end protrusion may be equal to or greater than a width of the second end protrusion.

The at least one protrusion may further include a center protrusion protruding from an inner position of the main portion.

A protruding length of the center protrusion may be less than a protruding length of each end protrusion.

The center protrusion and the end protrusions may be regularly arranged at an even distance.

The solar cell may further include a ribbon connected to the first electrode, and a width of a portion of the bus bar electrode provided with the at least one protrusion may be greater than a width of the ribbon.

A ratio of the width of the ribbon to a width of the main portion of the bus bar electrode may be in a range of 1:0.80 to 1:1.22.

The finger electrode may further include an align mark portion formed in a direction crossing the plurality of finger electrode portions at a position corresponding to a periphery of the at least one protrusion.

The photoelectric converter may include a semiconductor substrate and an emitter area, the photoelectric converter may further include an insulation film formed on the emitter area, the finger electrode may penetrate the insulation film to come into contact with the emitter area, and the bus bar electrode may be formed on the insulation film.

The finger electrode may have a double layer structure including a first layer located on the photoelectric converter and a second layer located on the first layer, and the bus bar electrode may include a single layer having the same thickness as the second layer and formed of the same material as the second layer.

The first layer and the second layer may be formed of different materials.

The solar cell may further include a ribbon connected to the second electrode, and a width of the entire second electrode may be greater than a width of the ribbon.

In accordance with another embodiment of the invention, there is provided a solar cell including a photoelectric converter and first and second electrodes connected to the photoelectric converter, wherein the first electrode includes a finger electrode including a plurality of finger electrode portions and a bus bar electrode including a main portion formed in a direction crossing the plurality of finger electrode portions, and at least one protrusion protruding from the main portion and formed in the direction crossing the plurality of finger electrode portions, and wherein a width of a portion of the bus bar electrode provided with the at least one protrusion is in a range of 2.1 mm to 3.4 mm.

BRIEF DESCRIPTION OF THE DRAWINGS

The above and other objects, features and other advantages of the embodiments of the invention will be more clearly understood from the following detailed description taken in conjunction with the accompanying drawings, in which.

DETAILED DESCRIPTION OF THE EMBODIMENTS

Reference will now be made in detail to embodiments of the invention, examples of which are illustrated in the accompanying drawings. However, it will be understood that the invention should not be limited to the embodiments and may be modified in various ways.

In the drawings, to clearly and briefly explain the invention, illustration of elements having no connection with the description is omitted, and the same or extremely similar elements are designated by the same reference numerals throughout the specification. In addition, in the drawings, for a more clear explanation, the dimensions of elements, such as thickness, width, and the like, are exaggerated or reduced, and thus the thickness, width, and the like of the invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell according to the embodiments of the invention will be described in detail with reference to the accompanying drawings.

Figure 1:
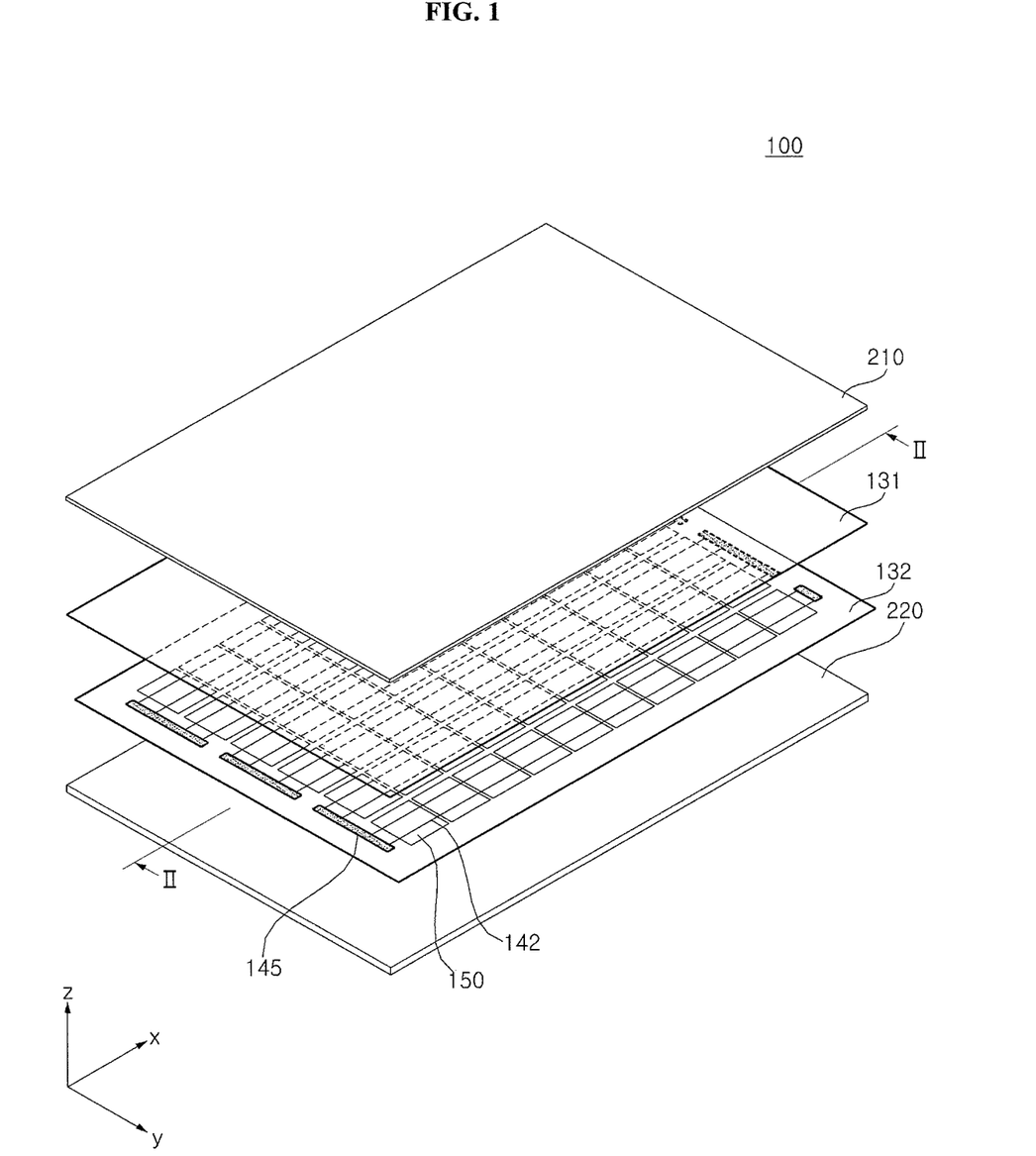
FIG. 1 is an exploded perspective view showing a solar cell module including solar cells according to one embodiment of the invention.
Figure 2:
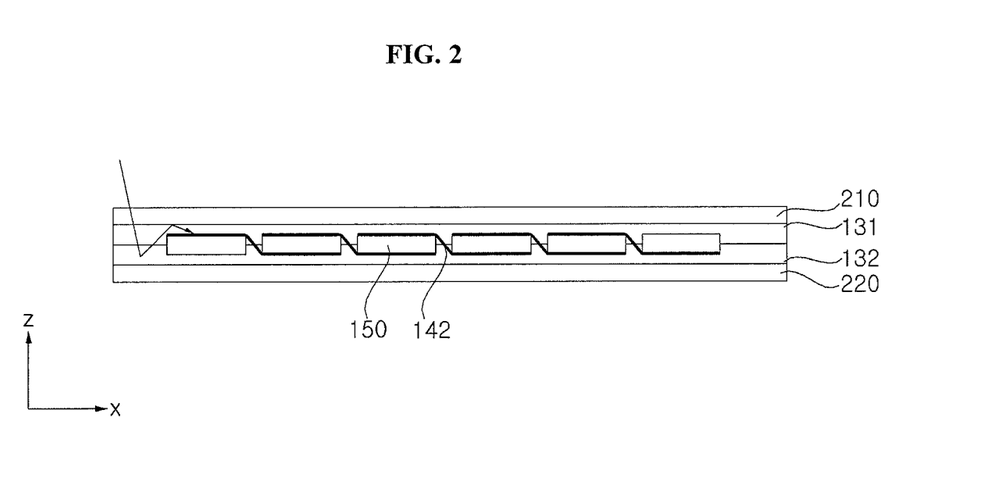
FIG. 2 is a schematic sectional view of the solar cell module taken along line II-II of FIG. 1.

FIG. 1 is an exploded perspective view showing a solar cell module including solar cells according to one embodiment of the invention, and FIG. 2 is a schematic sectional view of the solar cell module taken along line II-II of FIG. 1.

Referring to FIGS. 1 and 2, the solar cell module, designated by reference numeral 100, according to one embodiment of the invention may include solar cells 150, a front substrate 210 disposed at the front of the solar cells 150 and a back sheet 220 disposed at the back of the solar cells 150. In addition, the solar cell module 100 may include a first sealing material 131 between the solar cells 150 and the front substrate 210 and a second sealing material 132 between the solar cells 150 and the back sheet 220.

First, the solar cells 150 are semiconductor devices that convert sunlight into electrical energy. In one example, the solar cells 150 may be any one of various shapes of solar cells, such as silicon solar cells, compound semiconductor solar cells, tandem solar cells, dye sensitized solar cells, and the like.

The solar cells 150 include ribbons 142. The ribbons 142 serve to electrically connect the neighboring solar cells 150 to each other in series, in parallel, or in combinations thereof. More specifically, each ribbon 142 may interconnect a first electrode (see reference numeral 24 of FIG. 3) formed on a front surface of one solar cell 150 and a second electrode (see reference numeral 34 of FIG. 3) formed on a back surface of the other neighboring solar cell 150. That is, when the ribbon 142 is positioned to extend from the front surface of one solar cell 150 to the back surface of the other solar cell 150 and then is thermally compressed, the two solar cells 150 may be connected to each other by the ribbon 142. In this manner, a plurality of solar cells 150 may be connected to one another.

The ribbon 142 may be formed of one or more various materials having excellent electrical properties and physical properties. In one example, the ribbon 142 may include a solder, such as Sn/Ag/Cu based, Sn/Ag/Pb based, Sn/Ag based and Sn/Pb based solders. Alternatively, the ribbon 142 may include a highly conductive metal (for example, aluminum), or may be formed by stacking, for example, an anti-oxidation film on a solder. However, the invention is not limited thereto.

Although the term "ribbon 142" is used in the detailed description and other parts, the invention is not limited thereto. That is, in addition to the solder, the ribbon 142 may include any one of various structures for connection of solar cells 150.

In addition, bus ribbons 145 are provided to alternately connect adjacent ends of solar cell lines each including the solar cells 150 connected to one another by the ribbons 142. The bus ribbons 145 may be located at the ends of the solar cell lines to extend in a direction crossing the solar cell lines. The bus ribbons 145 are connected to a junction box, which gathers electricity produced by the solar cells 150 and prevents backflow of the electricity.

The first sealing material 131 may be located at the front of the solar cells 150, and the second sealing material 132 may be located at the back of the solar cells 150. The first sealing material 131 and the second sealing material 132 may be adhesively attached via lamination, thereby serving to block moisture or oxygen that may have a negative effect on the solar cells 150 and to achieve chemical bonding of constituent elements of the solar cells 150.

The first sealing material 131 and the second sealing material 132 may be ethylene vinyl acetate (EVA) copolymer resin, polyvinyl butyral, silicone resin, ester-based resin, olefin-based resin, and the like. However, the invention is not limited thereto. Thus, the first and second sealing materials 131 and 132 may be one or more various other materials, and may be formed via various other methods rather than lamination.

The front substrate 210 is disposed on the first sealing material 131 to transmit sunlight. Preferably, the front substrate 210 is tempered glass to protect the solar cells 150 from external shock, and the like. Additionally, low-iron tempered glass containing a low amount of iron may be used to prevent reflection of sunlight and to increase transmittance of sunlight.

The back sheet 220 is a layer disposed on the back of the solar cells 150 to protect the solar cells 150 and has waterproof, insulation and UV blocking functions. The back sheet 220 may be Tedlar/PET/Tedlar (TPT), without being limited thereto. Additionally, the back sheet 220 may be formed of a high reflectance material to enable reflection and reuse of sunlight introduced from the front substrate 210. However, the invention is not limited thereto, and the back sheet 220 may be formed of a transparent material to allow transmission of sunlight, which enables realization of a double-sided solar cell module 100.

An example configuration of one solar cell 150 among the plurality of solar cells 150 according to the embodiment of the invention will be described in detail with reference to FIGS. 3 to 6.

Figure 3:
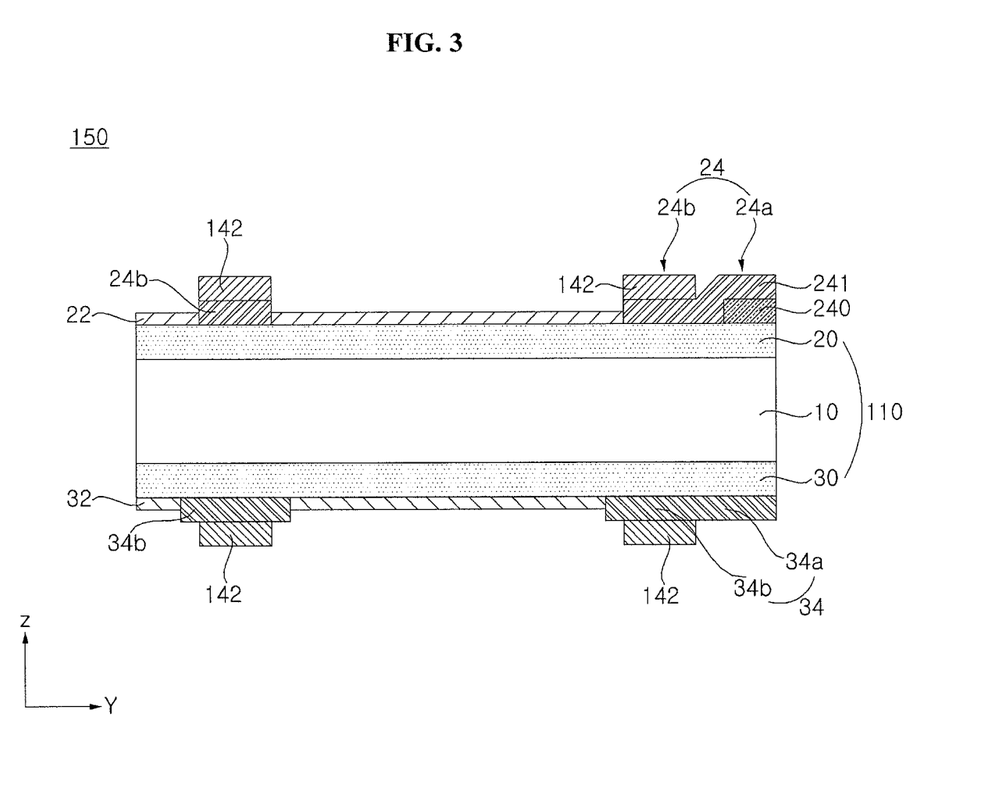
FIG. 3 is a partial sectional view of the solar cell according to the embodiment of the invention.

FIG. 3 is a partial sectional view of the solar cell according to the embodiment of the invention. For reference, FIG. 3 is a sectional view taken along line of FIG. 4.

Referring to FIG. 3, the solar cell 150 according to the embodiment of the invention may include a semiconductor substrate 110, dopant areas 20 and 30 formed on the semiconductor substrate 110 and electrodes 24 and 34 electrically connected to the dopant areas 20 and 30 or the semiconductor substrate 110. In addition, the solar cell 150 may include the ribbons 142 electrically connected to the electrodes 24 and 34 for connection with the neighboring solar cells 150. Here, the semiconductor substrate 110 and the dopant areas 20 and 30 contribute to photoelectric conversion, and thus may be defined as a photo-electric converter. The dopant areas 20 and 30 may include an emitter area 20 and a back surface field area 30, and the electrodes 24 and 34 may include a first electrode 24 electrically connected to the emitter area 20 and a second electrode 34 electrically connected to the back surface field area 30. In addition, the solar cell 150 may further include insulation films, such as, for example, an anti-reflection film 22 and a passivation film 32, formed at a front surface and/or a back surface of the semiconductor substrate 110. This will be described below in more detail.

The semiconductor substrate 110 consists of the dopant areas 20 and 30 and a base area 10. The base area 10, for example, may include silicon containing a first conductive dopant. The silicon may be single-crystal silicon or poly silicon, and the first conductive dopant may be an n-type dopant or a p-type dopant.

When the base area 10 includes a p-type dopant, the base area 10 may be formed of single-crystal silicon or poly silicon doped with a group-III element, such as boron (B), aluminum (A), gallium (Ga), Indium (In), etc. When the base area 10 includes an n-type dopant, the base area 10 may be formed of single-crystal silicon or poly silicon doped with a group-V element, such as phosphorous (P), arsenic (As), bismuth (Bi), antimony (Sb), etc. The base area 10 may be formed of one or more various other materials except for the aforementioned materials.

The front surface and/or the back surface of the semiconductor substrate 110 may be a textured surface provided with protrusions and recesses of various shapes (for example, a pyramidal shape). The textured front and/or back surface of the semiconductor substrate 110, provided with the protrusions and recesses, may attain increased surface roughness, which may reduce reflectance of incident light to the front surface and the back surface of the semiconductor substrate 110. Consequently, the quantity of light reaching the p-n junction at an interface of the base area 10 and the emitter area 20 may be increased, which results in minimized light loss. However, the invention is not limited thereto, and the front surface and the back surface of the semiconductor substrate 110 may have no protrusions and recesses formed by texturing.

The emitter area 20, which includes a second conductive dopant opposite to that of the base area 10, may be formed on the front surface of the semiconductor substrate 110. When the emitter area 20 includes an n-type dopant, the emitter area 20 may be formed of single-crystal silicon or poly silicon doped with P, As, Bi, Sb, etc. When the emitter area 20 includes a p-type dopant, the emitter area 20 may be formed of single-crystal silicon or poly silicon doped with Al, Ga, In, etc.

The drawing illustrates that the emitter area 20 has a homogeneous structure having a uniform doping density. However, the invention is not limited thereto. Thus, in another embodiment of the invention, the emitter area 20 may have a selective structure. In the selective structure, a portion of the emitter area 20 proximate to the first electrode 24 may have a high doping density and low resistance, and the remaining portion of the emitter area 20 may have a low doping density and high resistance. The emitter area 20 may have one of various other structures.

In the embodiment of the invention, the emitter area 20 is a doping area formed by doping the front surface of the semiconductor substrate 110 with the second conductive dopant. However, the invention is not limited thereto, and various alterations, such as a configuration in which the emitter area 20 is formed as a separate layer on the front surface of the semiconductor substrate 110, are possible.

The anti-reflection film 22 and the first electrode 24 are formed over the semiconductor substrate 110, more particularly, over the emitter area 20 formed on the semiconductor substrate 110.

The anti-reflection film 22 may be formed over substantially the entire front surface of the semiconductor substrate 110 except for a portion where the first electrode 24 is formed. The anti-reflection film 22 serves to reduce reflectance of incident light to the front surface of the semiconductor substrate 110 and to passivate defects present in a surface or a bulk of the emitter area 20.

Through reduction in the reflectance of incident light to the front surface of the semiconductor substrate 110, the quantity of light reaching the p-n junction at the interface of the base area 10 and the emitter area 20 may be increased. As such, short-circuit current Isc of the solar cell 150 may be increased. In addition, passivation of defects present in the emitter area 20 may remove a recombination site of a minority carrier, which may increase the open-circuit voltage Voc of the solar cell 150. As such, the anti-reflection film 22 may increase the open-circuit voltage and the short-circuit current of the solar cell 150, thereby enhancing the efficiency of the solar cell 150.

The anti-reflection film 22 may be formed of one or more various materials. In one example, the anti-reflection film 22 may have a single-layer film structure or a multi-layer film structure formed of at least one material selected from a group consisting of silicon nitride, silicon nitride containing hydrogen, silicon oxide, silicon oxide nitride, aluminum oxide, $MgF_2$, $ZnS$, $TiO_2$ and $CeO_2$. However, the invention is not limited thereto, and the anti-reflection film 22 may be formed of one or more various other materials. In addition, an additional front passivation film may be interposed between the semiconductor substrate 110 and the anti-reflection film 22. This falls within the scope of the invention.

The first electrode 24 is electrically connected to the emitter area 20 through an opening perforated in the anti-reflection film 22 (i.e. the first electrode 24 penetrating the anti-reflection film 22). The first electrode 24 may be formed of one or more various materials and may have any one shape among various shapes. The shape of the first electrode 24 will be described below with reference to FIGS. 4 and 5.

The back surface field area 30 is formed on the back surface of the semiconductor substrate 110. The back surface field area 30 includes the first conductive dopant in the same manner as the base area 10, and a doping density of the first conductive dopant in the back surface field area 30 is higher than that in the base area 10.

The drawing illustrates that the back surface field area 30 has a homogeneous structure having a uniform doping density. However, the invention is not limited thereto. Thus, in another embodiment of the invention, the back surface field area 30 may have a selective structure. In the selective structure, a portion of the back surface field area 30 proximate to the second electrode 34 may have a high doping density and low resistance, and the remaining portion of the back surface field area 30 may have a low doping density and high resistance. In another embodiment of the invention, the back surface field area 30 may have a local structure. In the local structure, the back surface field area 30 may be locally formed only proximate to the second electrode 34. The back surface field area 30 may have one of various other structures.

In the embodiment of the invention, the back surface field area 30 is a doping area formed by doping the back surface of the semiconductor substrate 110 with the first conductive dopant. However, the invention is not limited thereto, and various alterations, such as a configuration in which the back surface field area 30 is formed as a separate layer on the back surface of the semiconductor substrate 110, are possible.

The passivation film 32 may be formed over substantially the entire back surface of the semiconductor substrate 110 except for a portion where the second electrode 34 is formed. The passivation film 32 serves to passivate defects present in a surface or a bulk of the back surface field area 30.

The passivation film 32 may passivate defects present in the back surface field area 30, thereby removing a recombination site of a minority carrier, and consequently increasing the open-circuit voltage of the solar cell 150. As a result, through provision of the passivation film 32, the open-circuit voltage of the solar cell 150 may be increased, which results in enhanced efficiency of the solar cell 150.

The passivation film 32 may have a single-layer film structure or a multi-layer film structure formed of at least one material selected from a group consisting of silicon nitride, silicon nitride containing hydrogen, silicon oxide, silicon oxide nitride, aluminum oxide, $MgF_2$, ZnS, $TiO_2$ and $CeO_2$. However, the invention is not limited thereto, and the passivation film 32 may be formed of one or more various other materials. In addition, an additional film may be formed between the semiconductor substrate 110 and the passivation film 32, or may be formed on the passivation film 32. This falls within the scope of the invention.

The second electrode 34 is electrically connected to the back surface field area 30 through an opening perforated in the passivation film 32 (i.e. the second electrode 34 penetrating the passivation film 32). The second electrode 34 may be formed of one or more various materials and may have any one shape among various shapes. The shape of the second electrode 34 will be described below with reference to FIG. 6.

The ribbon 142 is located on the first electrode 24 and connected to the second electrode 34 of the neighboring solar cell 150. The other ribbon 142 is located on the second electrode 34 and connected to the first electrode 24 of the other neighboring solar cell 150.

Hereinafter, a configuration of the first electrode 24, the second electrode 34, and the ribbon 142 will be described in more detail.

Figure 4:
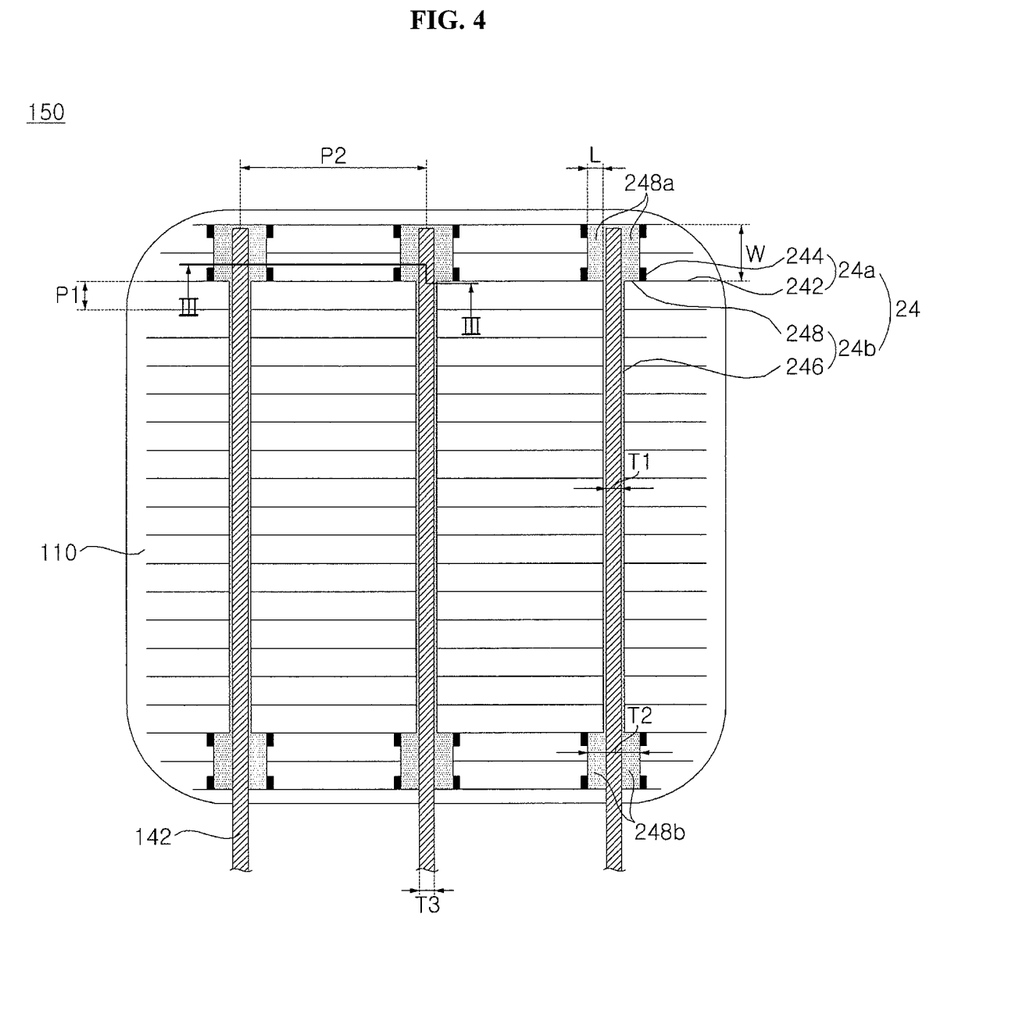
FIG. 4 is a front plan view of the solar cell according to the embodiment of the invention.
Figure 5:
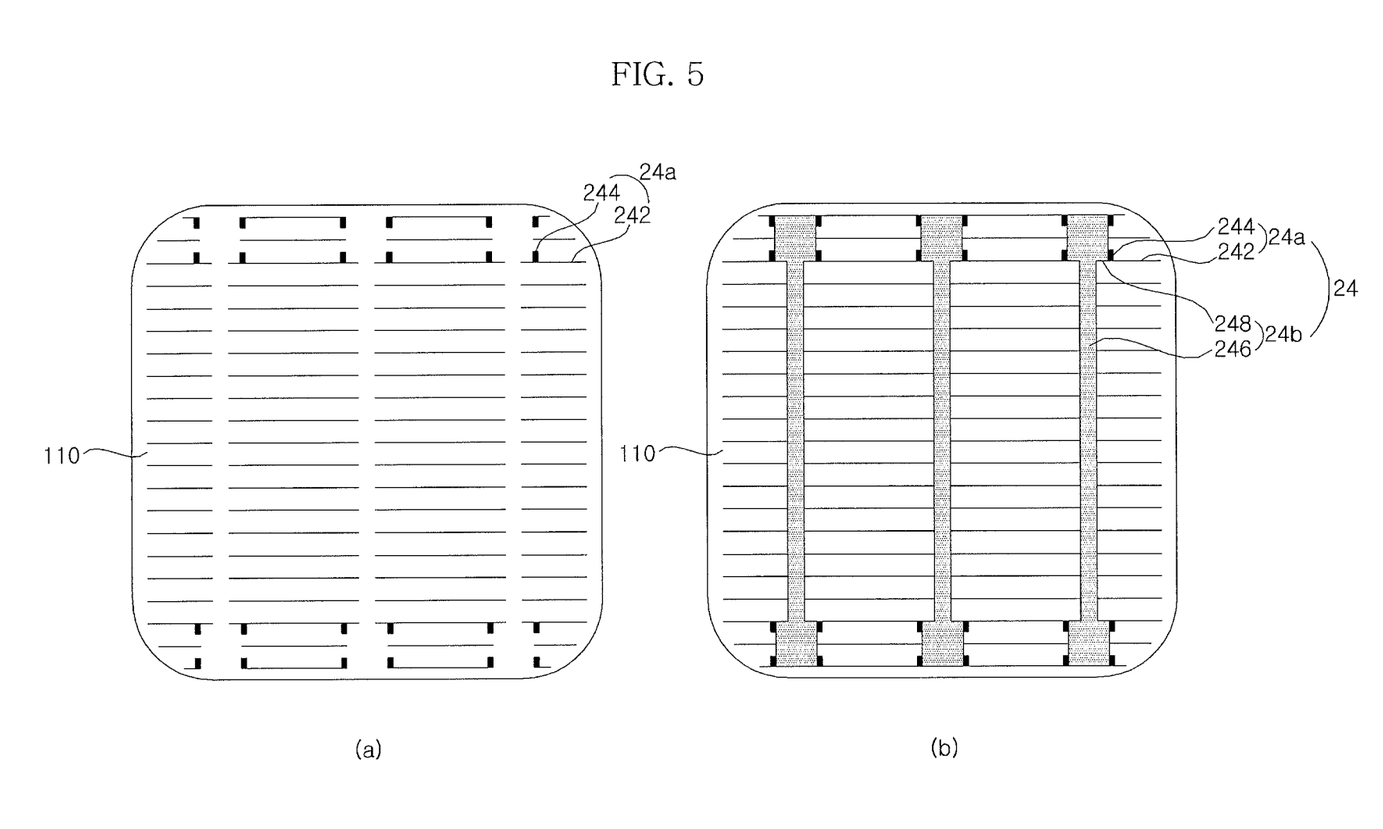
FIG. 5 is a front plan view showing a first layer and a second layer constituting a first electrode of FIG. 4.

FIG. 4 is a front plan view of the solar cell according to the embodiment of the invention, and FIG. 5 is a front plan view showing a first layer and a second layer constituting the first electrode 24 of FIG. 4. More specifically, (a) of FIG. 5 shows a first layer 240 of the first electrode 24 in the plan view (see also FIG. 3), and (b) of FIG. 5 shows both the first layer 240 and a second layer 241 of the first electrode 24 in the plan view (see also FIG. 3).

Referring to FIG. 4, in the embodiment of the invention, the first electrode 24 includes a finger electrode 24a having a plurality of finger electrode portions 242, and at least one bus bar electrode 24b formed in a direction crossing the finger electrode portions 242. In the embodiment of the invention, the bus bar electrode 24b includes a main portion 246 formed in a direction crossing the finger electrode portions 242, and at least one protrusion 248 protruding from the main portion 246. This will be described below in more detail.

The finger electrode portions 242 of the finger electrode 24a may be arranged in parallel to one another at a first pitch P1. The width of each finger electrode portion 242 may be in a range of 1 µm to 300 µm. When the width of the finger electrode portion 242 is below 1 µm, this may cause difficulty in manufacture and increased resistance. When the width of the finger electrode portion 242 exceeds 300 µm, this may increase a shading loss. When further considering the resistance and the shading loss, the width of the finger electrode portion 242 may be in a range of 30 µm to 120 µm. In addition, the first pitch P1 may be in a range of 500 µm to 3 mm. When the first pitch P1 is below 500 µm, a shading loss may be increased. When the first pitch P1 exceeds 3 mm, effective carrier collection may be difficult. To prevent the shading loss and to ensure effective carrier collection, the first pitch P1 may be in a range of 1 mm to 2.6 mm. However, the invention is not limited thereto, and the width of the finger electrode portion 242 and the first pitch P1 may be altered in various ways.

In the embodiment of the invention, the finger electrode 24a may further include align mark portion portions 244 formed in a direction crossing the finger electrode portions 242 at positions corresponding to the periphery of the bus bar electrode 24b (more particularly, the protrusion 248 of the bus bar electrode 24b). The align mark portion portions 244 may serve to align the protrusion 248 upon formation of the bus bar electrode 24b. This will be described below in more detail. Assuming that the finger electrode 24a includes the align mark portions 244, the align mark portions 244 are formed during formation of the finger electrode 24a, thereby assisting the finger electrode 24a in being precisely aligned with the bus bar electrode 24b. In this way, it is possible to improve alignment characteristics of the bus bar electrode 24b without an additional process.

The bus bar electrode 24b may be formed in a direction crossing the finger electrode portions 242 to thereby be connected to the finger electrode 24a. Only one bus bar electrode 24b may be provided, or a plurality of bus bar electrodes may be arranged at a second pitch P2 as shown by example in FIG. 4, the second pitch P2 being greater than the first pitch P1. The drawing illustrates that one bus bar electrode 24b is located on a center axis of the solar cell 150 and two bus bar electrodes 24b are symmetrically arranged about the center bus bar electrode 24b. However, the invention is not limited thereto, and various alterations are possible.

In the embodiment of the invention, the bus bar electrode 24b may include the main portion 246 having a first width T1, the main portion 246 extending by a long length in a direction crossing the finger electrode 24a (i.e. in a vertical direction of the drawing), and the protrusion 248 protruding from the main portion 246 in a direction crossing the main portion 246 (for example, in a direction parallel to the finger electrode portions 242 (i.e. in a horizontal direction of the drawing)). As such, a portion of the bus bar electrode 24b provided with the protrusion 248 has a second width T2 greater than the first width T1.

Additionally, the protrusion 248 extends together with the main portion 246 in an extending direction of the bus bar electrode 24b, which is the direction crossing finger electrode 24a. Each protrusion 248 may be formed across at least two of the finger electrode portions 242.

Here, the main portion 246 is designed to enable attachment of the ribbon 142 such that carriers gathered by the finger electrode 24a may be transmitted outward through the ribbon 142.

The main portion 246, which serves to transmit carriers gathered by the finger electrode 24a outward through the ribbon 142, may have the first width T1 greater than the width of the finger electrode 24a. This allows the carriers to be easily moved due to low resistance. Various alterations, such as a configuration in which the first width T1 of the main portion 246 is equal to or less than the width of the finger electrode 24a, are possible. Thus, the invention is not limited thereto.

As described above, since the main portion 246 is designed to permit attachment of the ribbon 142, the first width T1 of the main portion 246 may be equal to a third width T3 of the ribbon 142, or may be similar to the third width T3 (i.e. may be less than or greater than the third width T3 within a given range). In one example, a ratio of the third width T3 of the ribbon 142 to the first width T1 of the main portion 246 may be in a range of 1:0.80 to 1:1.22. When the ratio is below 1:0.8, the width of the main portion 246 is considerably less than the width of the ribbon 142, which may cause damage to the anti-reflection film 22 or the emitter area 20 due to the ribbon 142 protruding from the main portion 246. When the ratio exceeds 1:1.22, the width of the ribbon 142 is considerably less than the width of the main portion 246, which may cause carriers gathered via the bus bar electrode 24b to be less effectively transmitted outward through the ribbon 142. To more effectively transmit carriers while effectively preventing damage to the anti-reflection film 22 or the emitter area 20, the ratio may be in a range of 1:0.90 to 1:1.11. However, the invention is not limited thereto.

The protrusion 248 protruding from the main portion 246 serves to compensate for deterioration in alignment characteristics (i.e. misalignment) of the ribbon 142. In addition, the protrusion 248 serves to prevent damage to the anti-reflection film 22 or the emitter area 20 due to scratches, cracks or the like during alignment. This will be described below in more detail.

When misalignment of the ribbon 142 occurs, the ribbon 142 deviates from the bus bar electrode 24b. Such misalignment may cause the ribbon 142 to undergo leftward or rightward shift, tilting, or combinations thereof.

When misalignment of the ribbon 142 occurs as described above, a contact area between the ribbon 142 and the bus bar electrode 24b is reduced, causing increased resistance, which results in deterioration in the output power of the solar cell module (reference numeral 100 of FIG. 1).

In addition, the misaligned ribbon 142 may cause damage to the solar cell 150. Explaining this in more detail with reference to FIG. 1, the solar cell module 100 shown in FIG. 1 is fabricated by sequentially laminating the front substrate 210, the first sealing material 131, the solar cells 150 to which the ribbons 142 are attached, the second sealing material 132 and the back sheet 220, all of which are separately fabricated. However, when misalignment of the ribbon 142 occurs, ends of the ribbons 142 apply pressure to the anti-reflection film 22 or the emitter area 20 during lamination, causing damage to the anti-reflection film 22 or the emitter area 20, such as scratches or cracks. In addition, when the ribbons 142 comes into contact with the finger electrode portions 242, the finger electrode portions 242 having a relatively small width may be disconnected by thermal shock or physical shock. This phenomenon is referred to as Grid Interruption Caused by Soldering (GICS). GICS causes a portion of the finger electrode 24a to be disconnected from the bus bar electrode 24b, thus preventing transmission of carriers to the bus bar electrode 24b. Thereby, the carriers are unintentionally moved to other remote bus bar electrodes 24b, or cannot reach the corresponding bus bar electrode 24b. This causes reduction in the output power of the solar cell module 100.

As described above, since misalignment of the ribbon 142 may have a great effect on the performance, efficiency and other properties of the solar cell 150, in the embodiment of the invention, the protrusion 248 may be formed at the bus bar electrode 24b to cope with a misalignment of the ribbon 142. That is, even if misalignment of the ribbon 142 occurs, the protrusion 248 of the bus bar electrode 24 may come into contact with the ribbon 142, thereby compensating for reduction in the output power of the solar cell module 100.

In this case, the protrusion 248 may include end protrusions 248a and 248b respectively located at opposite ends of the bus bar electrode 24b (or at opposite ends of the main portion 246). The ends of the main portion 246 are locations where the greatest alignment error may occur. That is, when the ribbon 142 is misaligned by being tilted to the bus bar electrode 24b, the greatest alignment error may occur at the ends of the main portion 246. In the light of this problem, the end protrusions 248a and 248b may be respectively located at the ends of the main portion 246 to effectively compensate for reduction in a contact area between the misaligned ribbon 142 and the bus bar electrode 24b. In addition, since the anti-reflection film 22, the emitter area 20 and the finger electrode 24a may be easily damaged at the ends of the ribbon 142 during thermal compression as described above, providing the protrusion 248 with a large width may prevent the ribbon 142 from coming into contact with the aforementioned components even if misalignment of the ribbon 142 occurs.

More specifically, in the embodiment of the invention, the end protrusions 248a and 248b may include a first end protrusion 248a located at one end of the ribbon 142 and a second end protrusion 248b opposite to the first end protrusion 248a, from which the ribbon 142 extends to the neighboring solar cell 150. This arrangement of the end protrusions 248a and 248b may effectively cope with the greatest misalignment error at the ends of the bus bar electrode 24b. In addition, the first and second end protrusions 248a and 248b are symmetrically located at both sides of the main portion 246. Thereby, it is possible to effectively compensate for misalignment occurring at either side of the main portion 246. In this way, in one example, the bus bar electrode 24b may have an I-shaped form defined by the end protrusions 248a and 248b and the main portion 246. However, the invention is not limited thereto and various alterations are possible.

Each protrusion 248 may be formed across at least two of the finger electrode portions 242. This may provide the protrusion 248 with a sufficient width W (i.e. a width measured in a longitudinal direction of the bus bar electrode 24b), thereby allowing the protrusion 248 to effectively cope with the misalignment of the ribbon 142. In one example, when the protrusion 248 is sized to correspond to only one finger electrode portion 242, the width W of the protrusion 248 is less than the first pitch P1 of the finger electrode portions 242, and thus it is difficult to effectively prevent reduction in contact area between the bus bar electrode 24b and the ribbon 142. Accordingly, the protrusion 248 may formed across at least two finger electrode portions 242 to achieve a sufficient width W. In one example, the protrusion 248 may be formed across two to ten finger electrode portions 242. When the protrusion 248 is formed across eleven or more finger electrode portions 242, the width W of the protrusion 248 is excessively increased, which may increase the shading loss. When further considering the shading loss, the protrusion 248 may be formed across two to six finger electrode portions 242. Alternatively, the width W of the protrusion 248 may be in a range of 2 mm to 10 mm. When the width W of the protrusion 248 is below 2 mm, the protrusion 248 may have difficulty in effectively coping with the misalignment of the ribbon 142. When the width W of the protrusion 248 exceeds 10 mm, the shading loss may be increased. When further considering the shading loss, the width W of the protrusion 248 may be in a range of 2 mm to 6 mm. However, the invention is not limited thereto, and various alterations are possible.

Here, as described above, the first end protrusion 248a is located at a beginning end of the ribbon 142. The beginning end of the ribbon 142 is spaced apart from an end of the semiconductor substrate 110 by a given distance (for example, 2 mm to 3 mm). On the other hand, a portion of the ribbon 142 proximate to the second end protrusion 248a and extending to the neighboring solar cell 150 is not spaced apart from the semiconductor substrate 110. In the light of this configuration, the width W of the first end protrusion 248a may be equal to or greater than the width W of the second end protrusion 248a, in order to more effectively prevent the emitter area 20 and the like from being damaged by the beginning end of the ribbon 142.

In addition, a protruding length L of each protrusion 248 (i.e. a portion laterally protruding from the main portion 246), measured in a direction crossing a longitudinal direction of the main portion 246, may be less than the first width T1 of the main portion 246. The protruding length L may be determined in consideration of an alignment tolerance error because the alignment tolerance error is generally less than the first width T1 of the main portion 246. More specifically, the protruding length L of the protruding portion 248 may be in a range of 0.1 mm to 0.7 mm. This is because the protrusion 248 has difficulty in effectively coping with the misalignment of the ribbon 142 when the protruding length L is below 0.1 mm, and causes increased the shading loss and greater alignment tolerance error when the protruding length L exceeds 0.7 mm. However, the invention is not limited thereto, and various alterations are possible.

In the embodiment of the invention, the protrusion 248, which has the width W and the protruding length L as described above, protrudes from the main portion 246. Through provision of the protrusion 248, the second width T2 of the portion of the bus bar electrode 24b provided with the protrusion 248 may be in a range of 2.1 mm to 3.4 mm. Thereby, the second width T2 may be greater than the third width T3 of the ribbon 142. In this way, even if misalignment occurs as described above, the portion of the bus bar electrode 24b having the second width T2 may compensate for reduction in contact area between the bus bar electrode 24b and the ribbon 142, and may prevent damage to the emitter area 20, the anti-reflection film 22 and the finger electrode 24a due to the ribbon 142. In addition, the remaining portion of the bus bar electrode 24b where only the main portion 246 is present has the first width T1 less than the second width T2 of the portion of the bus bar electrode 24b provided with the protrusion 248, which may minimize the shading loss.

The first electrode 24 including the finger electrode 24a and the bus bar electrode 24b as described above may have a single layer structure or a multi-layer structure. In the embodiment of the invention, the first electrode 24 includes the first layer 240 and the second layer 241, which are sequentially stacked on the semiconductor substrate 110. Through provision of the first layer 240 and the second layer 241, the first electrode 24 may have a sufficient thickness to satisfy various desired properties. Moreover, materials, shapes and the like of the first layer 240 and the second layer 241 may be optimized to satisfy various desired properties.

In one example, the embodiment of the invention illustrates that the finger electrode 24a has a double layer structure consisting of the first layer 240 and the second layer 241 and the bus bar electrode 24b has a single layer structure including the second layer 241. That is, as shown by example in (a) of FIG. 5, the first layer 240 may include the finger electrode portions 242 and the align mark portions 244, which constitute the finger electrode 24a. In addition, as shown by example in (b) of FIG. 5, the second layer 241 may include the finger electrode 24a and the bus bar electrode 24b. The first layer 240 and the second layer 241 may be formed via various methods. For example, the first layer 240 and the second layer 241 may be formed by printing, deposition, plating, or the like.

Accordingly, the finger electrode 24a, which may have a relatively small width and a relatively small thickness, may be formed in a greater number of layers than that of the bus bar electrode 24b to achieve a sufficient thickness to satisfy various desired properties. In one example, the thickness of the finger electrode 24a may be greater than the thickness of the bus bar electrode 24b. In addition, the bus bar electrode 24b having a relatively large width may have a single layer structure to achieve a reduction of material costs and the like.

The first layer 240 and the second layer 241 may be formed of the same material or different materials. In one example, the first layer 240 may be formed of a material that causes fire-through via thermal treatment, for example, and the second layer 241 may be formed of a material that does not cause fire-through. Thereby, the finger electrode 24a including the first layer 240 may penetrate the anti-reflection film 22 as an insulation film to come into contact with the emitter area 20 so as to gather carriers of the emitter area 20. In addition, the bus bar electrode 24b including only the second layer 241 may not penetrate the anti-reflection film 22 and may be located above the emitter area 20 with the anti-reflection film 22 interposed therebetween. Thereby, the anti-reflection film 22 or the passivation film below the bus bar electrode 24b may maintain a fixed charge, which may contribute to gathering of carriers.

However, the invention is not limited thereto, and a stacking structure of the first electrode 24 may be altered in various ways.

Figure 6:
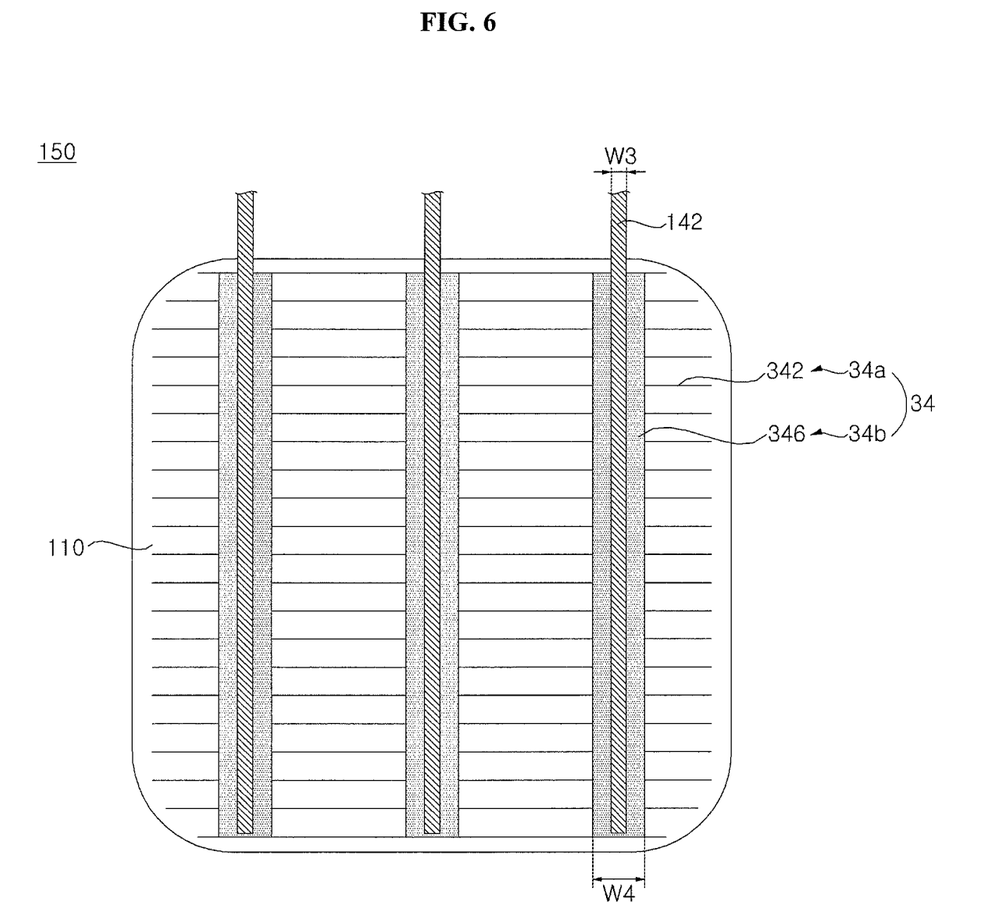
FIG. 6 is a rear plan view of the solar cell according to the embodiment of the invention.

FIG. 6 is a rear plan view of the solar cell according to the embodiment of the invention.

Referring to FIG. 6, in the embodiment of the invention, the second electrode 34, which is a back electrode formed at the back surface of the semiconductor substrate 110, may include a finger electrode 34a and a bus bar electrode 34b. In this case, in the embodiment, the finger electrode 34a of the second electrode 34 may include a plurality of finger electrode portions 342 only, and the bus bar electrode 34b may include a main portion 346 only. The finger electrode portions 342 and the main portion 346 are equal to or similar to those of the first electrode 24, and thus a detailed description thereof will be omitted herein.

In this case, a width W4 of the main portion 346 may be greater than a third width W3 of the ribbon 142. As such, even if misalignment of the ribbon 142 occurs, it is possible to sufficiently compensate for this misalignment. This is because the second electrode 34 located at the back surface of the semiconductor substrate 110 has less burden of the shading loss than the first electrode 24 located at the front surface of the semiconductor substrate 110, and thus may have a greater width than that of the ribbon 142. In this way, the second electrode 34 may effectively cope with the misalignment of the ribbon 142. However, the invention is not limited thereto, and the second electrode 34 may have the same structure as the first electrode 24. This falls within the scope of the invention. In addition, the second electrode 34 may have various other known structures.

As described above, according to the embodiment of the invention, the first electrode 24 and/or the second electrode 34 may have an improved structure to effectively prevent deterioration in the output power of the solar cell module 100 and damage to the solar cell 150, which may, for example, occur upon misalignment of the ribbon 142. As a result, the output power and reliability of the solar cell module 100 may be improved.

Although the above-described embodiment of the invention illustrates that the bus bar electrode 24b of the first electrode 24 as the front electrode includes the protrusion 248, the invention is not limited thereto. At least one of the bus bar electrodes 24b and 34b of the first and second electrodes 24 and 34 may include the protrusion 248. Various other alterations are possible.

Hereinafter, solar cells according to other embodiments of the invention will be described in detail with reference to FIGS. 7 to 9. A detailed description related to the same or similar components of the above-described embodiment of the invention will be omitted, and only different components will be described below in detail.

Figure 7:
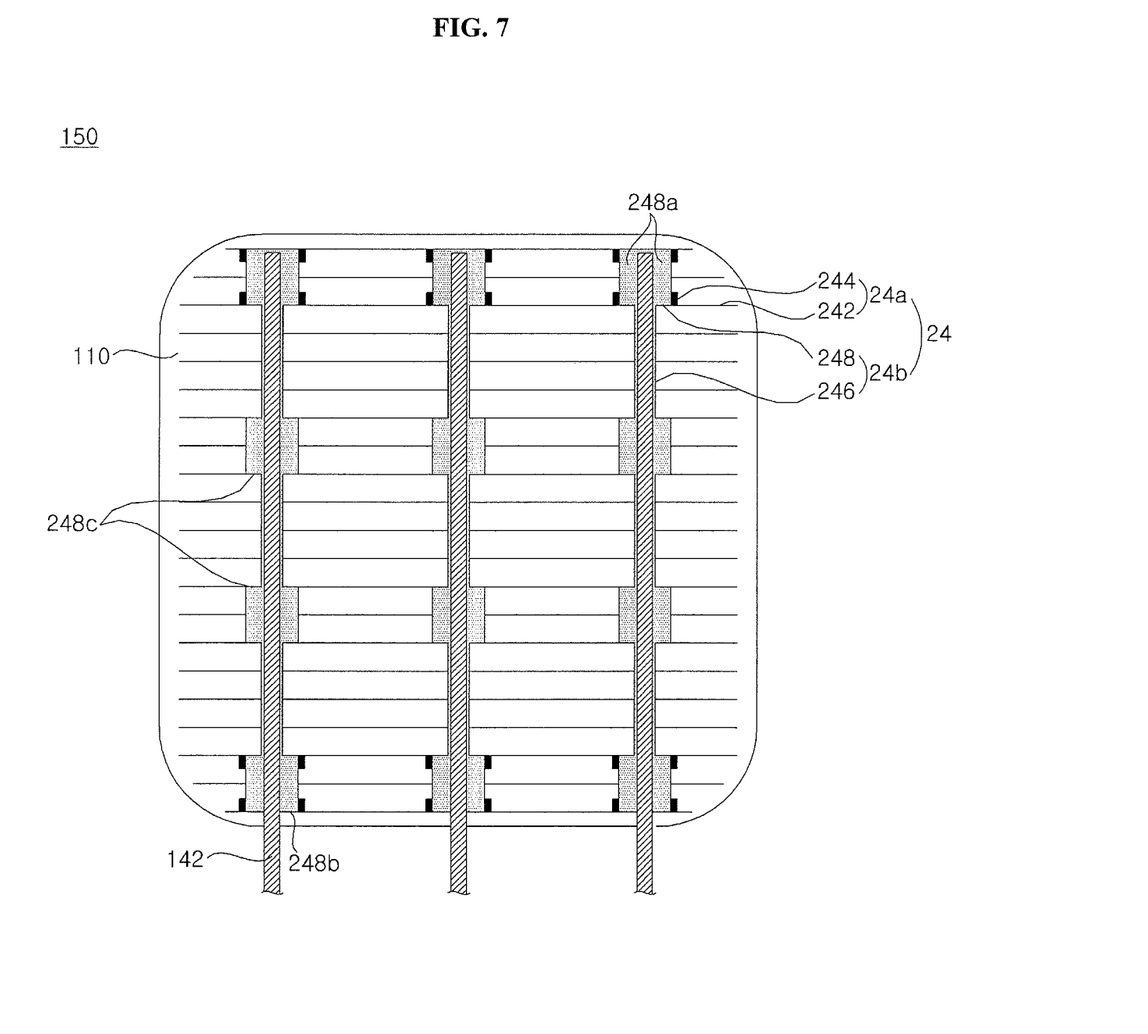
FIG. 7 is a front plan view showing a solar cell according to another embodiment of the invention.

FIG. 7 is a front plan view showing a solar cell according to another embodiment of the invention.

Referring to FIG. 7, the protrusion 248 formed at the first electrode 24 of the solar cell 150 according to the embodiment of the invention includes a center protrusion 248c protruding from the main portion 246 at a position between the first end protrusion 248a and the second end protrusion 248b. A single center protrusion 248c or a plurality of center protrusions 248c may be provided.

In the embodiment of the invention, the first end protrusion 248a, the second end protrusion 248b, and the center protrusion 248c may be regularly arranged at an even distance and may have an even size. Here, the even distance and the even size refer to a distance and a size that may be typically considered as the same distance and the same size in consideration of error and the like. In one example, the even distance and the even size may refer to a distance and a size having a margin of error of 10% or less. This serves to prevent the solar cell 150 from being damaged by a device used to attach the ribbon 142 to the bus bar electrode 24b.

More specifically, the ribbon 142 may be bonded to the bus bar electrode 24b via tabbing, for example. In this case, tabbing to secure the ribbon 142 located on the bus bar electrode 24b may be implemented by arranging a plurality of hold pins spaced apart from one another by a constant distance on the ribbon 142, and then ejecting hot air thereto through, e.g., nozzles between the hold pins. In this case, the hold pins may cause damage to the insulation film, the emitter area and the like of the solar cell 150. In the light of this, in the embodiment of the invention, the protrusion 248 is sized to correspond to the distance between the hold pins, so as to prevent damage to the solar cell 150 at contacts between the hold pins and the ribbon 142.

Accordingly, the embodiment of the invention may prevent problems caused upon bonding of the ribbon 142, thereby effectively preventing damage to the solar cell 150.

Figure 8:
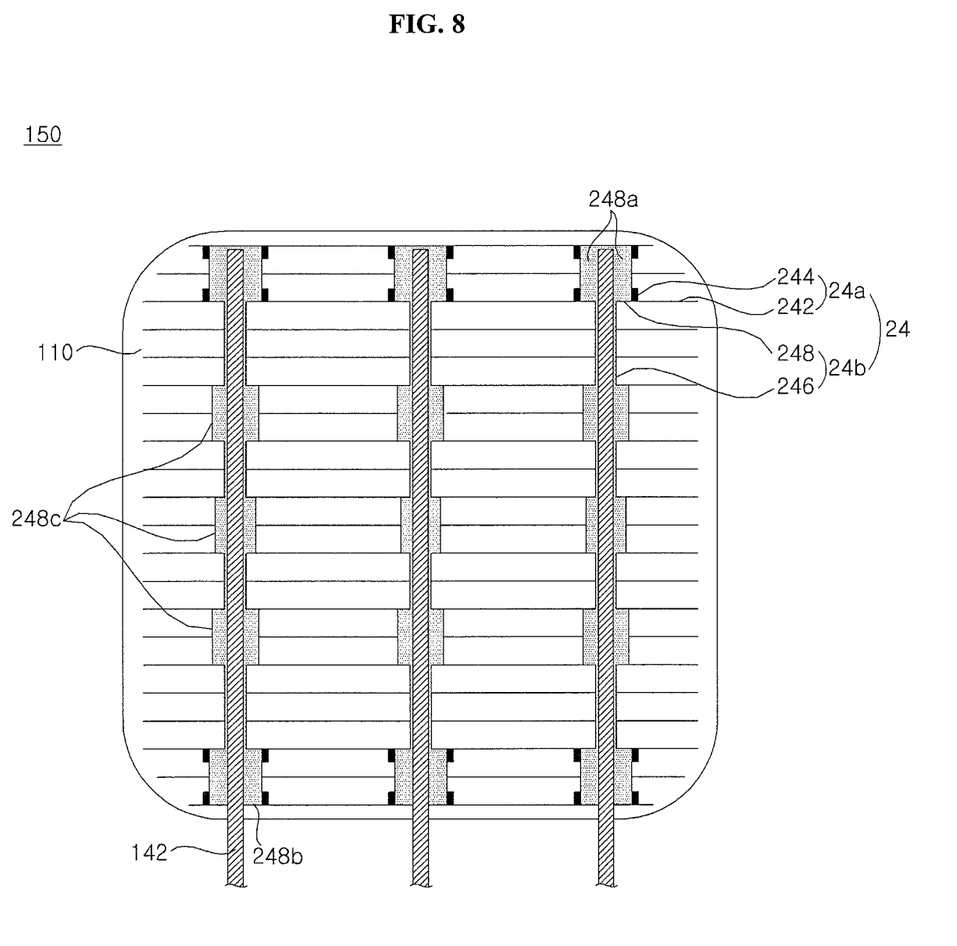
FIG. 8 is a front plan view showing a solar cell according to still another embodiment of the invention.

FIG. 8 is a front plan view showing a solar cell according to still another embodiment of the invention.

Referring to FIG. 8, the protrusion 248 formed at the first electrode 24 of the solar cell 150 according to the embodiment of the invention includes the center protrusion 248c protruding from the main portion 246 at a position between the first end protrusion 248a and the second end protrusion 248b. A single center protrusion 248c or a plurality of center protrusions 248c may be provided.

In the embodiment of the invention, the protruding length of the center protrusion 248c may be less than the protruding length of the end protrusions 248a and 248b. In a case in which a plurality of center protrusions 248c is provided, the protruding lengths of the respective center protrusions 248c may be reduced such that the protruding length of the center protrusion 248c closer to the center is less than the protruding length of the center protrusion 248c closer to each end protrusion 248a or 248b. This is because, when the ribbon 142 is misaligned and tilted to the bus bar electrode 24b, an alignment error at the center is less than an alignment error at the end of the bus bar electrode 24b. That is, the end protrusion 248a or 248b located at a location where a great alignment error occurs may require a great protruding length to cope with the misalignment of the ribbon 142, and the protruding length of the center protrusion 248c located at the center may be reduced to minimize the shading loss while coping with an alignment error.

Figure 9:
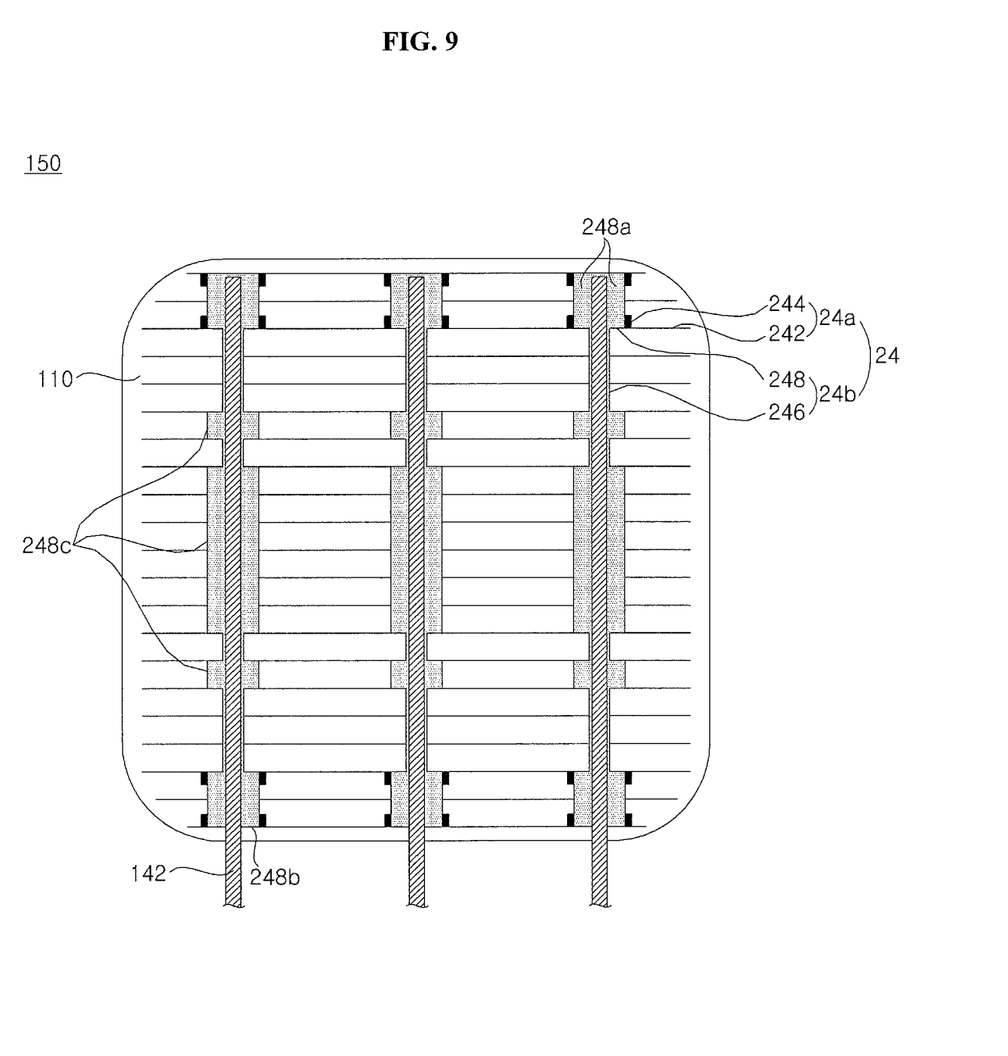
FIG. 9 is a front plan view showing a solar cell according to another embodiment of the invention.

FIG. 9 is a front plan view showing a solar cell according to another embodiment of the invention.

Referring to FIG. 9, the protrusion 248 formed at the first electrode 24 of the solar cell 150 according to the embodiment of the invention includes the center protrusion 248c protruding from the main portion 246 at a position between the first end protrusion 248a and the second end protrusion 248b. A single center protrusion 248c or a plurality of center protrusions 248c may be provided.

In the embodiment of the invention, the center protrusions 248c may have a different width from that of the first and second end protrusions 248a and 248b, and may be arranged at different distances. As described above, arrangement of the protrusions 248a, 248 and 248c may be altered in various ways.

The above described features, configurations, effects, and the like are included in at least one of the embodiments of the invention, and should not be limited to only one embodiment. In addition, the features, configurations, effects, and the like as illustrated in each embodiment of the invention may be implemented with regard to other embodiments of the invention as they are combined with one another or modified by those skilled in the art. Thus, content related to these combinations and modifications should be construed as including in the scope and spirit of the invention as disclosed in the accompanying claims.

What is claimed is:

1. A solar cell module comprising:
    a solar cell comprising,
        a semiconductor substrate,
        an emitter formed on one surface of the semiconductor substrate,
        a first electrode formed on the emitter, and
        a second electrode formed on the semiconductor substrate; and
    a ribbon connected to the first electrode,
    wherein the first electrode includes:
        a plurality of finger electrode portions extending in a first direction; and
        a bus bar electrode including a main portion formed in a direction crossing the plurality of finger electrode portions and having a constant first width, a first protrusion formed at a first end of the main portion and having a second width greater than the first width, and a second protrusion formed at a second end opposite the first end of the main portion and having a third width greater than the first width,
    wherein align mark portions are formed at edges of the first and second protrusions,
    wherein side surfaces of the align mark portions physically contact with side surfaces of the first and second protrusions at the edges of the first and second protrusions,
    wherein the align mark portions are formed at a portion outside of an area where the ribbon passes so that the align mark portions do not overlap with the ribbon,
    wherein the align mark portions have four align mark portions that are arranged at the edges of the first and second protrusions, respectively, thereby the four align mark portions are disposed at four edges of the first and second protrusions, respectively, so as to achieve horizontal symmetry and vertical symmetry with respect to each protrusion, and
    wherein each align mark portion has an area smaller than each protrusion.

2. The solar cell module according to claim 1, wherein a protruding length of the first and second protrusions is in a range of 0.1 mm to 0.7 mm.

3. The solar cell module according to claim wherein the second and third widths of the first and second protrusions are in a range of 2.1 mm to 3.4 mm.

4. The solar cell module according to claim 1, wherein the first and second protrusions are formed across two to ten finger electrode portions among the finger electrode portions.

5. The solar cell module according to claim 1, wherein the second width and the third width of a portion of the bus bar electrode provided with the first and second protrusions is in a range of 2 mm to 10 mm.

6. The solar cell module according to claim 1, wherein the ribbon has one end located on the bus bar electrode and the other end extending to a neighboring solar cell,
    wherein the first protrusion is proximate to the one end of the ribbon located on the bus bar electrode, and the second protrusion is located opposite to the first protrusion, and
    wherein the second width of the first protrusion is equal to or greater than the third width of the second protrusion.

7. The solar cell module according to claim 1, wherein the bus bar electrode includes a center protrusion protruding from an inner position of the main portion.

8. The solar cell module according to claim 7, wherein a protruding length of the center protrusion is less than a protruding length of each of the first and second protrusions.

9. The solar cell module according to claim 7, wherein the center protrusion and the first and second protrusions are regularly arranged at an even distance.

10. The solar cell module according to claim 1, wherein the ribbon has one end located on the bus bar electrode and the other end extending to a neighboring solar cell, and
    wherein a ratio of a width of the ribbon to the first width of the main portion of the bus bar electrode is in a range of 1:0.80 to 1:1.22.

11. The solar cell module according to claim 1, wherein the align mark portions are formed in the direction crossing the plurality of finger electrode portions.

12. The solar cell module according to claim 1, further comprising an insulation film formed on the emitter,
    wherein the finger electrode portions penetrate the insulation film to come into contact with the emitter, and
    wherein the bus bar electrode is formed on the insulation film.

13. The solar cell module according to claim 1, wherein the finger electrode portions have a double layer structure including a first layer located on the semiconductor substrate and a second layer located on the first layer, and
    wherein the bus bar electrode includes a single layer having the same thickness as the second layer and formed of the same material as the second layer.

14. The solar cell module according to claim 13, wherein the first layer and the second layer are formed of different materials.

15. The solar cell module according to claim 1, wherein a width of the entire second electrode is greater than a width of the ribbon.

16. A solar cell module comprising:
    a solar cell comprising,
        a photoelectric converter, and
        first and second electrodes connected to the photoelectric converter; and
    a ribbon connected to the first electrode,
    wherein the first electrode includes:
        a finger electrode including a plurality of finger electrode portions and align mark portions; and
        a bus bar electrode including a main portion formed in a direction crossing the plurality of finger electrode portions and having a first width, a first protrusion formed at a first end of the main portion and having a second width greater than the first width, and a second protrusion formed at a second end opposite the first end of the main portion and having a third width greater than the first width,
    wherein the first and second protrusions are formed in the direction crossing the plurality of finger electrode portions,
    wherein portions of the bus bar electrode provided with the first and second protrusions respectively have the second width and the third width in a range of 2.1 mm to 3.4 mm,
    wherein the first and second protrusions are end protrusions respectively in a direction of extension of the main portion and located at opposite edges of a side of the photoelectric converter, wherein the align mark portions are formed at edges of the first and second protrusions, and an apart distance of the align mark portions is the second width in a direction crossing the bus bar electrode, wherein the align mark portions physically contact with side surfaces of the first and second protrusions at the edges of the first and second protrusions, wherein the align mark portions are formed at a portion outside of an area where the ribbon passes so that the align mark portions do not overlap with the ribbon, wherein the align mark portions have four align mark portions that are arranged at the edges of the first and second protrusions, respectively, thereby the four align mark portions are disposed at four edges of the first and second protrusions, respectively, so as to achieve horizontal symmetry and vertical symmetry with respect to each protrusion, and wherein each align mark portion has an area smaller than each protrusion.

17. The solar cell module according to claim 1, wherein each of the four align mark portions also physically contacts at least one of the plurality of finger electrode portions.

18. The solar cell module according to claim 16, wherein each of the four align mark portions also physically contacts at least one of the plurality of finger electrode portions.

19. The solar cell module according to claim 1, wherein a protruding length of the first or second protrusion is less than the first width of the main portion, and wherein two of the four align mark portions contact an outermost finger electrode portion that is closest to an edge of the semiconductor substrate among the plurality finger electrode portion, and remaining two of the four align mark portions contact another finger electrode portion, and a length of the outermost finger electrode portion is less than a length of the another finger electrode portion.

20. The solar cell module according to claim 17, wherein, for each finger electrode portion that contacts the align mark portions from among the plurality of finger electrode portions, the align mark portions extend in the direction from only one side of the each finger electrode.

* * * * *